(12) United States Patent
Schell et al.

(10) Patent No.: US 8,995,495 B2
(45) Date of Patent: Mar. 31, 2015

(54) TUNABLE DBR LASER AND A METHOD OF OPERATING A TUNABLE DBR LASER

(71) Applicant: Fraunhofer-Gesellschaft zur Foerderung der Angewandten Forschung e.V., Munich (DE)

(72) Inventors: Martin Schell, Berlin (DE); Patrick Runge, Berlin (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 0 days.

(21) Appl. No.: 14/375,434

(22) PCT Filed: Dec. 10, 2012

(86) PCT No.: PCT/EP2012/074919
§ 371 (c)(1),
(2) Date: Jul. 30, 2014

(87) PCT Pub. No.: WO2013/113437
PCT Pub. Date: Aug. 8, 2013

(65) Prior Publication Data
US 2015/0023382 A1 Jan. 22, 2015

(30) Foreign Application Priority Data

Jan. 30, 2012 (DE) .......................... 10 2012 002 077

(51) Int. Cl.
*H01S 3/08* (2006.01)
*H01S 5/068* (2006.01)
(52) U.S. Cl.
CPC ..................................... *H01S 5/068* (2013.01)
USPC ............................... 372/96; 372/99; 372/102

(58) Field of Classification Search
USPC .............................................. 372/96, 102, 99
See application file for complete search history.

(56) References Cited

U.S. PATENT DOCUMENTS 6,061,481 A * 5/2000 Heidrich et al. ................ 385/14
6,571,031 B1 * 5/2003 Augustsson .................... 385/24

(Continued)

FOREIGN PATENT DOCUMENTS

DE 19522591 A1 1/1997
DE 19548547 A1 6/1997

(Continued)

OTHER PUBLICATIONS

International Preliminary Report on Patentability issued in PCT/EP2012/074919, mailed Feb. 14, 2014, 23 pgs.

(Continued)

*Primary Examiner* — Kinam Park
(74) *Attorney, Agent, or Firm* — Faegre Baker Daniels LLP

(57) ABSTRACT

A tunable DBR laser including: an amplifier section, a part-reflecting optical output, a connection section connected to the amplifier section, and at least two wavelength-selective reflectors optically coupled to the amplifier section via the connection section. The connection section includes at least one MMI coupler and several waveguides, so that different optical paths lead from the amplifier section to the wavelength-selective reflectors and each of the different optical paths leads through the at least one MMI coupler and through one of the waveguides. The wavelength-selective reflectors differ from one another by having different reflection spectra and each of the wavelength-selective reflectors is connected to one of several outputs of the at least one MMI coupler. By activating a phase shifter, arranged in a course of at least one of the waveguides, the DBR laser can be switched between different resonators.

17 Claims, 3 Drawing Sheets

(56) References Cited

U.S. PATENT DOCUMENTS

| | | | |
|---|---|---|---|
| 6,687,267 B2* | 2/2004 | Bukkems | 372/20 |
| 2003/0035446 A1* | 2/2003 | Griffel | 372/20 |
| 2010/0142567 A1* | 6/2010 | Ward et al. | 372/20 |
| 2011/0267676 A1 | 11/2011 | Dallesasse et al. | |

FOREIGN PATENT DOCUMENTS

| | | |
|---|---|---|
| DE | 60038034 T2 | 2/2009 |
| WO | WO2007107187 A1 | 9/2007 |

OTHER PUBLICATIONS

International Search Report and Written Opinion issued in PCT/EP2012/074919, mailed Nov. 11, 2013, 16 pgs.

Wesstrom et al., Design of a widely tunable modulated grating Y-branch laser using the additive Vernier effect for improved supermode selection, 2002 IEEE 18th International Semiconductor Laser Conference, Conference Digest (Cat. No. 02CH37390), 2002, pp. 99-100, 2 pgs.

* cited by examiner

US 8,995,495 B2

TUNABLE DBR LASER AND A METHOD OF OPERATING A TUNABLE DBR LASER

CROSS-REFERENCE TO RELATED APPLICATIONS

This application is a national phase application of PCT Application No. PCT/EP2012/074919, internationally filed Dec. 10, 2012, which claims priority to German Application No. 10 2012 002 077.5, filed Jan. 30, 2012, both of which are herein incorporated by reference in their entirety.

TECHNICAL FIELD

This disclosure relates to a tunable DBR laser and to a method for operating a tunable DBR laser.

BACKGROUND

The use of wavelength-selective reflectors is known for the selection and/or stabilisation of an emission wavelength of a laser. Such reflectors can delimit an optical resonator of the laser at one end of the resonator and for example be designed as Bragg reflectors, also called DBR (distributed Bragg reflectors). Such lasers are therefore indicated as DBR lasers. Bragg reflectors normally comprise a multitude of dielectric layers with an alternating refractive index, wherein a reflection spectrum of the Bragg reflector is determined by a thickness and by refractive indices of the dielectric layers. The reflectivity of the Bragg reflector has a maximum when a wavelength of the incident light is equal to the multiple of an optical path length of an individual one of the layers of the reflector.

The wavelength of the reflection maximum of a Bragg reflector can be changeable for example by way of changing the temperature or by way of applying an electrical field, and a change of an effective refractive index which this entails. An emission wavelength of DBR lasers known from the state of the art, on account of this, can be tuned within a wavelength region which typically however is very restricted. A laser, with which a wavelength-selective element is designed as a Bragg reflector and with which a refractive index of a material of the Bragg reflector can be changed, is disclosed for example in the document EP 2 169 788 A1. A rapid setting between different emission wavelengths with such a laser is however only possible to a limited extent due to the necessary temperature stabilisation of the reflector. Moreover, it would be advantageous if the wavelength region, within which the emission wavelength of the laser is changeable, could be increased.

SUMMARY

It is an object of the present disclosure, to develop a laser, with which an emission wavelength can be adjusted within as wide as possible limits and as rapidly as possible. Moreover, a method for operating such a laser, in each case with an as precisely defined as possible emission wavelength which can be freely selected from an as broad as possible wavelength region is moreover to be developed.

What is put forward is a tunable DBR laser, comprising an amplifier section containing an active material, a part-reflecting optical output, a connection section which at an end of the amplifier section which lies opposite to the output of the DBR laser connects to the amplifier section, and a wavelength-selective reflector which is optically coupled to the amplifier section by way of the connection section. The DBR laser comprises at least one further wavelength selective reflector, which is likewise optically coupled to the amplifier section by way of the connection section, and the connection section comprises at least one MMI coupler, wherein the wavelength-selective reflectors differ from one another by way of different reflection spectra and are in each case connected to one of several outputs of the at least one MMI coupler, wherein the connection section comprises several waveguides running next to one another, so that in each case different optical paths lead from the amplifier section to each of the reflectors, through the at least one MMI-coupler and in each case one of the waveguides, and wherein a phase shifter is arranged in a course of at least one of these waveguides, so that the DBR laser, by way of activating the at least one phase shifter, can be switched over between different resonators which are delimited in each case by one of the wavelength-selective reflectors.

Moreover, what is suggested here is a method for operating such a DBR laser, wherein the at least one phase-shifter is activated in a manner such that light which is produced in the amplifier section and is coupled out from the amplifier section into the connection section is guided only onto exactly one of the wavelength-selective reflectors, so that the DBR laser emits laser light of an emission wavelength, which is selected from a broader gain spectrum of the amplifier section, in a manner dependent on the reflection spectrum of this selected reflector.

The disclosure is based on the concept of realising an optical switch in the form of the MMI coupler in combination with the at least one phase shifter, with whose help in each case one of the different optical resonators of the laser can be selected, by way of the light produced in the amplifier section being guided in each case only onto precisely one of the wavelength-selective reflectors. With this, the emission wavelength of the DBR laser can be selected and/or set in dependence on the reflection spectrum of the wavelength-selective reflector which delimits the selected resonator. The wavelength region, within which the emission wavelength of the laser can be set, is thus merely limited by a gain spectrum of the active material. One can switch between the different resonators in a rapid and reliable manner with the optical switch which is realised by the MMI coupler and the at least one phase shifter.

Light which is produced in the amplifier section can run through the at least one MMI coupler at least twice with a complete circulation in the respectively selected optical resonator. Thus the demand of the light produced in the amplifier section having to be able to run through this in two opposite directions, in order to then be coupled again into the amplifier section, is placed on the connection section with the at least one MMI coupler and the at least one phase shifter. This condition can be fulfilled by way of a suitable setting of the at least one phase shifter, by way of phase relations for two opposite propagation direction of the light produced in the amplifier section being taken into account by the MMI coupler.

The term "tunable" with regard to the subject matter claimed here, is to be understood in that the emission wavelength of the DBR laser is changeable, without an infinite adjustability being necessarily required. Thus laser light of the emission wavelength which is defined by the respectively selected wavelength-selective reflector and is adjustable by way of switching over between the different reflectors can be coupled out at the optical output of the DBR laser. The thus selectable emission wavelengths can thereby be different to one another within relative wide limits, in particular of the amplifier section has an as broad-banded as possible gain spectrum. In some embodiments, the optical coupling between the amplifier section and the at least one MMI coupler as well as between the at least one MMI coupler and the wavelength-selective reflectors is realised completely or partly by optical waveguides which for example can be formed as ridge waveguides arranged on a substrate or as optical fibres. A diameter of a single-mode waveguide can be smaller than 10 µm.

In some embodiments, at least one of the wavelength-selective reflectors is designed as a Bragg reflector. Bragg reflectors are characterised by a particularly narrow-band reflecting spectrum, so that the DBR laser is configured to emit laser light with a particularly narrow spectral line width. This is advantageous for many applications.

The MMI coupler—MMI stands for multi mode interference—in a simple manner can be realised as a waveguide structure with several inputs and outputs and which is widened compared to simple waveguides such that several modes have space therein. The MMI coupler comprises at least one input, at which the light produced in the amplifier section can be coupled into the MMI coupler preferably by way of a single-mode waveguide. The MMI coupler can be designed in a single-layered or multi-layered manner. It can be designed in a monolithic manner with a substrate, from which it can be separated by an optical buffer layer.

Usually, the at least one input of the MMI coupler on the one hand and the several outputs of the MMI coupler on the other hand are arranged on sides of the MMI coupler which lie opposite one another. In some embodiments, the outputs of the MMI coupler are arranged relative to one another such that light coupled out of the MMI coupler has a defined phase difference to one another at the different outputs of the MMI coupler. This results due to the fact that the different modes interfere in a manner defined by the geometry of the MMI coupler.

The at least one phase shifter can be configured to change an optical path length of that one of the waveguides arranged next to one another, in whose course it is arranged. An optical phase of a share of the light produced in the amplifier section, said share propagating in this waveguide, can be changed by way of activating the at least one phase shifter, e.g. by $\Delta\phi$ with $0 \le |\Delta\phi| \le \pi$, wherein $\Delta\phi$ is to indicate the change of the optical phase. This phase change can be effected by way of a change of the effective refractive index at least in one section of this waveguide. In some embodiments, a phase shifter is arranged in each of the waveguides running next to one another, wherein the phase shifters can then be activated independently of one another. A light intensity of light which is coupled out at the outputs of the respective MMI coupler which are connected to the wavelength-selective reflectors can be controlled by way of activation of the at least one phase shifter. In particular, the at least one phase shifter can therefore be activated in a manner such that the light produced in the amplifier section arrives in each case at only precisely one of the wavelength-selective reflectors. At least one of the waveguides running next to one another can be designed as a single-mode waveguide. In some embodiments, this applies to all the waveguides running next to one another. It is advantageous if a phase shifter is arranged in the course of each of the waveguides running next to one another.

The gain spectrum of the amplifier section of the DBR laser and which is given by the active material can have a FWHM of more than 10 nm, of more that 20 nm, more than 50 nm or more than 100 nm. The selectable emission wavelength of the DBR laser can e.g. be smaller than 2000 nm, smaller than 1500 nm, smaller than 1000 nm, smaller than 800 nm or smaller than 600 nm and/or larger than 200 nm, larger than 300 nm or larger than 400 nm.

In some embodiments, the DBR laser is characterised in that the connection section comprises a first MMI coupler and a second MMI coupler, wherein outputs of the first MMI coupler are connected in each case to one of several inputs of the second MMI coupler by way of the waveguides running next to one another, and wherein the wavelength-selective reflectors are connected in each case to one of several outputs of the second MMI coupler.

The light produced in the amplifier section, with these embodiments can be coupled at the several inputs of the second MMI coupler into the second MMI coupler, wherein relative optical phases of the light coupled into the second MMI coupler at the several inputs of the second MMI coupler can be changed relative to one another by way of the at least one phase shifter. A phase shifter can be arranged in a course of each of the waveguide which run next to one another and which connect the outputs of the first MMI coupler to the inputs of the second MMI coupler. A number of degrees of freedom for the control of light intensities which are coupled out of the second MMI coupler in each case at outputs of the second MMI coupler or which can be coupled out is increased in an advantageous manner by way of this. With a complete circulation of the light produced in the amplifier section, in the respectively selected optical resonator, each of the two MMI couplers with these embodiments can be run through exactly twice, and specifically in each case in the opposite direction with the two sweeps.

In some embodiments, the MMI coupler comprises at least two further outputs which lie opposite the outputs of this MMI coupler, said outputs being connected to the wavelength-selective reflectors, and which are connected in each case by way of one of the waveguide running next to one another, to a mirror which reflects back into the respective waveguide, wherein the amplifier section is optically coupled to an input of this MMI coupler, which can lie opposite the mentioned further outputs.

In these embodiments, normally precisely only one MMI coupler is necessary, so that the DBR laser can be designed in a particularly compact and space-saving manner. It is advantageous if a phase shifter is arranged in the course of each of the waveguides running next to one another. The waveguides connecting the outputs of the MMI coupler to the wavelength-selective reflectors can be designed in each case completely or at least partly as single-mode waveguides. At least one of the mirrors or all of the mirrors can be designed as waveguide facets or waveguide ends. These can but however do not necessarily need to be mirrored. The light produced in the amplifier section can run through the MMI coupler exactly four times with a complete circulation in the respectively selected optical resonator. Thereby, the light after a first sweep through the MMI coupler is completely or at least partly reflected on at least one of the mirrors. After a second sweep through the MMI coupler, this light is then completely or at least partly reflected at exactly one of the wavelength-selective reflectors. After a third sweep through the MMI coupler, this light is completely or at least partly again reflected at least one of the mirrors. After a fourth sweep through the MMI coupler, the light is then completely or at least partly led through the input of the MMI coupler back into the amplifier section.

Common to the embodiments which are described here by way of example is the fact that the light produced in the amplifier section must pass an MMI coupler twice on its way to the respectively selected wavelength-selective reflector—either twice through the same MMI coupler or two different MMI couplers in each case.

The at least one MMI coupler can be an N×N coupler. Thereby, it is the case of a MMI coupler, with which a number of several inputs of the MMI coupler is equal to the number of several outputs of the MMI coupler. In some embodiments, the MMI coupler is designed as a 4×4 90° hybrid. Likewise, the MMI coupler or one of the MMI couplers can be designed as a 1×N coupler.

The changeability of the phase of the respective light share can be realised in a simple manner by way of the at least one phase shifter comprising a heating element and/or being designed as an electro-optical element. The effective refractive index or an optical wavelength of that one of the waveguides running next to one another, in which the respective phase shifter is arranged, can be changed in such a manner and/or by way of applying an electrical and/or a magnetic field. For example, the electro-optical element can comprise at least one pair of electrodes, to which an electrical voltage can be applied. In some embodiments, the phase shifter can change an optical phase of the light which is produced in the amplifier section and which is led in the respective waveguide, in a rapid manner and with great precision.

In some embodiments, the DBR laser comprises a semiconductor substrate, on which at least the amplifier section is arranged, wherein the semiconductor substrate and/or at least one waveguide arranged on the semiconductor substrate and/or the at least one MMI coupler is completely or at least partly formed from InP or InGaAsP or InGaAlAs.

With regard to the semiconductor substrate, it can be the case for example of a microchip. Apart from the amplifier section, also the at least one MMI coupler and/or the wavelength-selective reflectors can be arranged on the semiconductor substrate. In particular, the semiconductor substrate and the amplifier section and/or the at least one waveguide arranged on the semiconductor substrate and/or the at least one MMI coupler arranged on the semiconductor substrate and/or the wavelength-selective reflectors arranged on the semiconductor substrate can be formed monolithically, thus on a single substrate. This permits a particularly compact design of the DBR laser or at least of the components of the DBR laser which are arranged on the semiconductor substrate. For example, the DBR laser can likewise be integrated into an optical and/or optoelectronic circuit arranged on the semiconductor substrate. The DBR laser can also comprise a substrate which is formed completely or at least partly of a polymer, instead of the semiconductor substrate or additionally to this.

In some embodiments, the amplifier section and the connection section are arranged on different substrates, wherein preferably an end of the amplifier section which faces the connection section and/or an end of the connection section which faces the amplifier section is de-mirrored. Thus e.g. it is possible in a so-called hybrid integration, to arrange the amplifier section on a semiconductor substrate, but to arrange all other mentioned components on a polymer substrate.

The fact that with these embodiments, the amplifier section and the connection section are arranged on different substrates permits a multitude of arrangements of the different components of the DBR laser. Power losses which could occur when coupling in light from the amplifier section into the connection section or out of the connection section into the amplifier section are minimised due to the mirroring of the end of the end of the amplifier section which faces the connection section and/or of the end of the connection section which faces the amplifier section. With these embodiments, the amplifier section and the connection section are preferably optically coupled by way of a waveguide which can e.g. be designed as an optical fibre.

All common laser-capable semiconductor materials can be used as an active material, for example can contain the active InP and/or InGaAsP and/or InGaAlAs.

In some embodiments, the amplifier section is thus given in the form of a semiconductor crystal, a semiconductor diode or another solid body crystal. Of course, the active material can also comprise a multitude of further materials or connections, in particular a multitude of further semiconductor connections. A gain spectrum of the amplifier section or of the active material can be selected and/or set with a greater flexibility due to the design of the amplifier section of the DBR laser as a semiconductor laser, as a diode laser or as a solid body laser. The DBR laser can thus be used or a multitude of applications.

A reflectivity of the part-reflecting optical output with an emission wavelength of the DBR laser can be selected such that it is at least 75 percent and/or at the most 95 percent. For example, a power of the laser light coupled out of the DBR laser can be set by way of a suitable selection or setting of the reflectivity of the part-reflecting optical output.

In some embodiments at least one of the wavelength-selective reflectors can be tuned in an infinite manner, so that the reflection spectrum of this reflector can be changed and be shifted to larger or smaller wavelengths at least in certain limits.

A tuning element can be provided for the stepless tuning of the at least one continuously tunable wavelength-selective reflector. This element can comprise a heating element and/or an electro-optical element and preferably be arranged directly on the respective wavelength-selective reflector. Apart from the switching-over between the different optical resonators, it is also possible to change the emission wavelength of the laser by way of changing the reflection spectrum of the continuously tunable reflector. The DBR laser can thus be applied in an even more flexible manner and adaptable to special applications. In particular, the wavelength-selective reflectors can be designed in a manner such that the wavelength regions, within which the different wavelength-selective reflectors can be tuned in each case, overlapping one another in edge regions and taken together, cover the complete gain spectrum of the amplifier section or at least an as large as possible region of the gain spectrum of the amplifier section. With this, all or at least a large part of the light wavelengths which can be amplified by the active material can be continuously set as the emission wavelength of the DBR laser, on the one hand by way of activating the at least one phase shifter and the switching between the different resonators which is effected by this and on the other hand by way of the tuning of the reflection spectra of the wavelength-selective reflectors.

BRIEF DESCRIPTION OF THE DRAWINGS

Embodiments of the disclosure are represented in the drawings and are explained in more detail by way of the following description. There are shown in.

DETAILED DESCRIPTION

Figure 1:
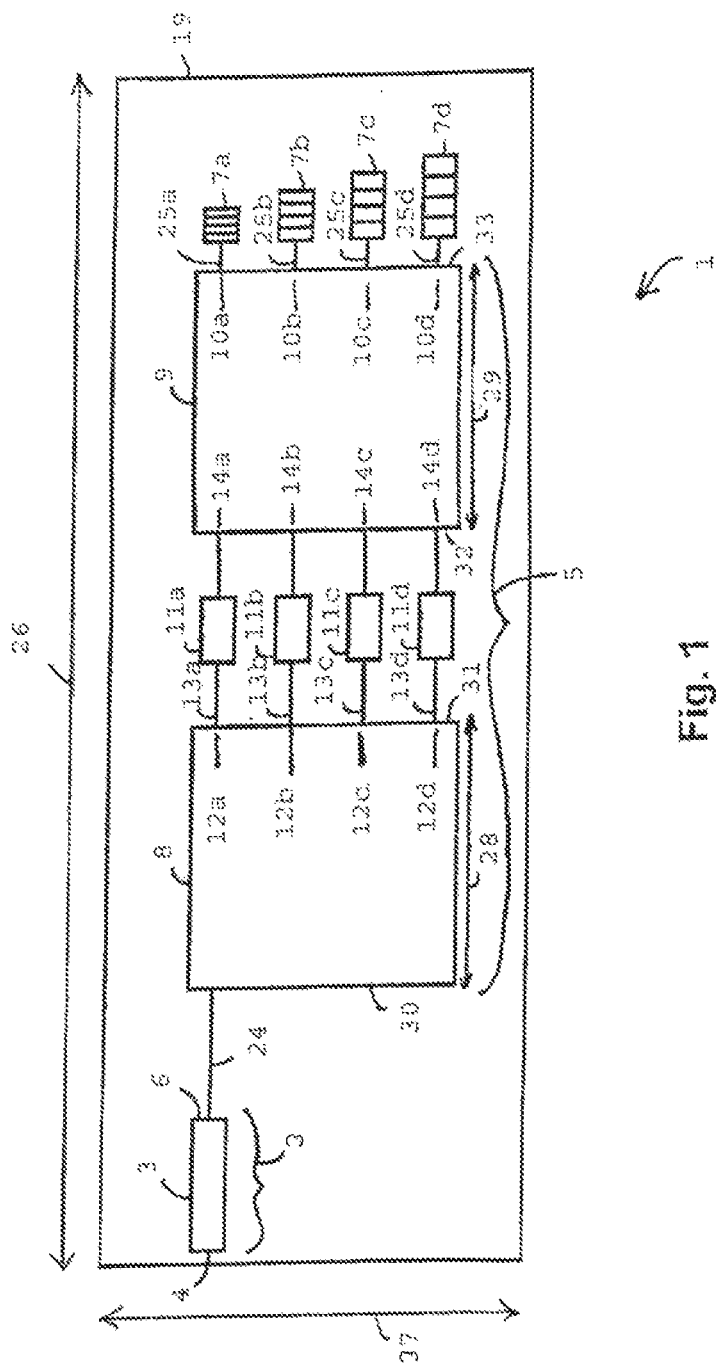
FIG. 1 embodiments of a DBR laser, which comprises two MMI couplers, wherein an amplifier section and a connection section are arranged on the same semiconductor substrate, FIG. 2 embodiments of the DBR laser, with which the amplifier section and the connection section are arranged in each case on different substrates, as well as FIG. 3 embodiments of the DBR laser, wherein the DBR laser has exactly one MMI coupler.

FIG. 1 shows embodiments of a tunable DBR laser 1. An amplifier section 2 of the DBR laser 1 comprises an active material 3 which is given in the form of an InP/InGaAsP diode. In some embodiments, the active material 3 can contain InGaAlAs. A gain spectrum of the active material 3 has a maximum at a wavelength of 1550 nm and a full width half maximum FWHM of about 40 nm. A part-reflecting optical output 4 of the laser 1 is given by a boundary surface of the active material 3. A reflectivity of the optical output 4 for the light in a wavelength region of 1500 nm to 1600 nm is between 75% and 95%. A connection section 5 of the DBR laser 1 connects to the amplifier section 2, at an end 6 of the amplifier section 2 which lies opposite the optical output 4 of the laser 1. The connection section 5 comprises a first MMI coupler 8 and a second MMI coupler 9. The first MMI coupler 8 is a 4×4 coupler, of which only one input 23 is occupied and which moreover comprises four outputs 12a to 12d. The second MMI coupler 9 is likewise a 4×4 coupler with four inputs 14a to 14 d, and four outputs 10a to 10d. The end 6 of the amplifier section 2 is connected via a single-mode waveguide 24 to the input 23 of the first MMI coupler 8.

The outputs 12a to 12d of the first MMI coupler 8 are connected by way of single-mode waveguides 13a to 13d, in each case to one of the inputs 14a to 14d of the second MMI coupler 9. In each case, of four phase shifters 11a to 11d is arranged in the course of each of the waveguides 13a to 13d. In the present example, the phase shifters 11a to 11d are thereby each designed as an electro-optical element. In particular, the phase shifters 11a to 11d each comprise an electrode pair which is arranged directly on the respective waveguide and to which an electrical voltage can be applied in each case. An effective refractive index of the waveguides 13a to 13d can be changed regionally in each case by way of applying the electrical voltage to the electrodes of the phase shifters 11a to 11d. In other words, the phase shifters 11a to 11d are each configured to continuously change an optical path length of the waveguides 13a to 13d for light which is produced in the amplifier section 2 and is led in the waveguides 13a to 13d. In this manner, relative optical phases of the light which is produced in the amplifier section 2 and is led in the waveguides 13a to 13d can be changed by way of the phase shifters 11a to 11d, in each case independently of one another. In some embodiments, the phase shifters 11a to 11d can also each comprise a heating element, alternatively or additionally to the electro-optical elements. These heating elements are also then configured to change the refractive index of the waveguides 13a to 13d in each case at least in regions, and thus to effect a change of the optical path length of the waveguides 13a to 13d for the light which is produced in the amplifier section 2 and is led in the waveguides 13a to 13d.

The outputs 10a to 10d of the second MMI coupler 9 are connected in each case via single-mode waveguides 25a to 25d in each case to one of four different wavelength-selective reflectors 7a to 7d. The single-mode waveguides 25a to 25d are thus each configured to guide light which is produced in the amplifier section 2 and is coupled out of the second MMI coupler 9 at the outputs 10a to 10d, in each case onto exactly one of the reflectors 7a and 7d, and to lead the light which is reflected at the reflectors 7a to 7d back into the respective single-mode waveguides 25a, 25b, 25c and 25d respectively, back to the outputs 10a and 10d and there to couple it again into the MMI coupler 9. The wavelength-selective reflectors 7a to 7d are thus each optically coupled to the amplifier section 2 by way of the connection section 5.

The wavelength-selective reflectors 7a to 7d in the present example are each designed as Bragg reflectors. They thus each comprise a multitude of dialectic layers with an alternating refractive index. The reflectors 7a to 7d are thereby integrated into the single-mode waveguide 25a, 25b, 25c, and 25d respectively, at whose end they are arranged. Thereby, the reflectors 7a to 7d are designed in a manner such that their reflection spectra differ from one another. In particular, reflection maxima of the reflection spectra of the reflectors 7a to 7d in each case lie at different wavelengths. Additionally, the wavelength-selective reflectors 7a to 7d are continuously tunable, so that their reflection spectra are displaceable in each case within certain limits. For this, a tuning element which is not shown is arranged on each of the reflectors 7a to 7d. The tuning elements are configured to change the refractive indices of the dielectric layers of that Bragg reflector on which they are arranged in each case, and by way of this to shift the reflection maximum of the respective reflector. In the example shown here, the tuning elements arranged on the reflectors 7a to 7d in each case are designed as heating elements. The tuning elements arranged on the reflectors 7a to 7d can be activated independently of one another, so that the reflection spectra of the reflectors 7a to 7d can be continuously changed independently of one another.

In the present example, a first reflection maximum of the first reflector 7a can be continuously tuned in a wavelength region of 1530 to 1540 nm. A second reflection maximum of the second reflector 7b is continuously changeable in a second wavelength region of 1540 nm to 1550 nm. A third reflection maximum of the third reflector 7c is continuously changeable in a third wavelength region of 1550 nm to 1560 nm. A fourth reflection maximum of the fourth reflector 7d is continuously tunable in a fourth wavelength region of 1560 nm to 1570 nm. The reflection spectra 6 of the reflectors 7a to 7d are particularly sharp in the mentioned wavelength regions, within which the reflection maxima of the reflection spectra are changeable in each case. A relative FWHM $\Delta\lambda_{FWHM}/\lambda_{MAX}$ of the reflection spectra of the reflectors 7a to 7d in the present example is less than $10^{-7}$ in each case. Thereby $\Delta\lambda_{FWHM}$ indicates the FWHM of the respective reflection spectrum and $\lambda_{MAX}$ that wavelength which is assigned to the value of maximal reflectivity.

The DBR laser 1 is designed in a monolithic manner and is arranged completely on a semiconductor substrate 19 of silicon. In other words, the active material 3, the MMI couplers 8 and 9, the wavelength-selective Bragg reflectors 7a to 7d as well as the waveguides 24, 25a to 25d and the waveguides 13a to 13d with the phase shifters 11a to 11d are arranged on the same semiconductor substrate 19. The semiconductor substrate 19 forms a microchip with a length 26 of 6 mm and a width 27 of 2 mm. The MMI coupler 8 and 9 as well as the single-mode waveguide 24, 13a to 13d and 25a to 25d are formed in each case of InGaAlAs, InP or InGaAsP. The diameter of the waveguides 24, 13a to 13d, 25a to 25d is each 2.5 μm. The MMI couplers 8 and 9 are each designed in a planar manner and have the same dimensions. In a plane represented in FIG. 1, the MMI couplers 8 and 9 are each rectangularly shaped, wherein lengths 28 and 29 of the MMI couplers 8 and 9 are each about 1500 μm. A width of the MMI couplers 8 and 9 which is perpendicular to the lengths 28 and 29 is approx. 30 μm in each case.

The outputs 12a and 12d of the MMI coupler 8, the inputs 14a to 14d of the MMI coupler MMI coupler 9 and the outputs 10a to 10d of the MMI coupler 9 are each arranged in a plane in a regular manner at equidistant intervals. The outputs 12*a* to 12 *d* of the first MMI coupler 8 are arranged at the same second side 31 of the first MMI coupler 8 which lies opposite a first side 30 of the first MMI coupler 8 which comprises the input 23 of the MMI coupler 8. The inputs 14*a* to 14*d* are arranged on a first side 32 of the second MMI coupler 9, and the outputs 10*a* to 10*d* are arranged at a second side 33 of the second MMI coupler 9 which lies opposite the first side 32.

As to how the DBR laser 1 can be switched between different optical resonators by way of activating the phase shifters 11*a* to 11*d* is described hereinafter, wherein the different optical resonators are delimited by the different wavelength-selective Bragg reflectors 7*a* to 7*d*. A first optical resonator is delimited by the optical output 4 and the first reflector 7*a*. A second optical resonator is delimited by the optical output 4 and the second reflector 7*b*. A third optical resonator is delimited by the optical output 4 and the third reflector 7*c*. A fourth optical resonator is delimited by the optical output 4 and the fourth reflector 7*d*.

Light produced by way of creating a population inversion in the active material 3 is coupled at the input 23 into the first MMI coupler 8 via the single-mode waveguide 24. By way of this, optical modes supported by a geometry of the first MMI coupler 8 are excited in the first MMI coupler 8. This light is coupled into the single-mode waveguides 13*a* to 13*d* at the outputs 12*a* to 12*d* of the first MMI coupler 8. Thereby, phases of the light waves which are coupled into the waveguides 13*a* to 13*d* at the outputs 12*a* to 12*d* are temporally constant relative to one another and are defined by the geometry of the first MMI coupler 8. In the present example, a phase difference at adjacent outputs of the outputs 12*a* to 12*d* amount to 90° in each case. This light is led by the single-mode waveguides 13*a* to 13*d* to the inputs 14*a* to 14*d* of the second MMI coupler 9, wherein the phases of the light waves which are led through the waveguides 13*a* to 13*d* and arrive at the inputs 14*a* to 14*d* are in each case changeable in dependence on an activation of the phase shifters 11*a* to 11*d*, and are set depending on which of the resonators are to be activated. Optical modes of the second MMI coupler 9 are excited by way of coupling the light led in the waveguides 13*a* to 13*d* into the second MMI coupler 9 via the inputs 14*a* to 14*d*. An excitation of the optical modes of the second MMI coupler 9 is dependent on a geometry of the MMI coupler 9, in particular on an arrangement of the inputs 14*a* to 14 at the first side of 32 of the second MMI coupler 9 as well as on relative phases of the light components which at the inputs 14*a* to 14*d* are coupled out of the waveguides 13*a* to 13*d* into the second MMI coupler 9.

The optical modes of the second MMI coupler can be excited by way of a suitable activation of the phase shifters 11*a* to 11*d*, in a manner such that in each case light is coupled out into one of the waveguides 25*a* to 25*d* in each case at only exactly one of the outputs 10*a* to 10*d* of the second MMI coupler 9. In other words, the coherent light which is produced in the amplifier section 2 and is led in the waveguides 13*a* to 13*d*, by way of the activation of the phase shifters 11*a* to 11*d* in the second MMI coupler 9 can be brought into interference in a manner such that it constructively interferes in each case at only precisely one of the outputs 10*a* to 10*d*, whereas an interference at the remaining of the outputs 10 to 10*d* is destructive in each case. The connection section 5 which includes the MMI couplers 8 and 9, the waveguides 13*a* to 13*d* as well as the phase shifters 11*a* to 11*d*, is thus configured to act as an optical switch, with which the light produced in the amplifier section 2 can be guided in each case onto only exactly one of the Bragg reflectors 7*a* to 7*d*. The laser 1 is switched onto the first optical resonator delimited by the optical output 4 and by the first reflector 7*a*, for example by way of the phase shifters 11*a* to 11*d* being activated in a manner such that the light produced in the active material 3 is only guided onto the first reflector 7*a*. In the same manner, the light can be led onto one of the other reflectors 7*b*, 7*c*, or 7*d* and the DBR laser 1 accordingly onto the second, third or fourth resonator.

The light which is reflected in this manner at the first reflector 7*a* in the first mentioned case is coupled via the waveguide 25*a* and the first output 10*a* back into the second MMI coupler 9. This light gets back into the amplifier section 2 via the waveguides 13*a* to 13*d*, the first MMI coupler 8 and the waveguide 24. With a complete circulation in the first resonator, the light produced in the amplifier section 2 runs through each of the MMI couplers 8 and 9 thus exactly twice, and specifically in the opposite direction. In a completely analogous manner, the laser 1 can be switched over onto the second, third or the fourth resonator by way of activation of the phase shifters 11*a* to 11*d*. The emission wavelength of the laser thus on the one hand is defined by the activation of the phase shifters 11*a* to 11*d* and on the other hand by the reflection spectrum of that one of reflectors 7*a* to 7*d*, onto which the light emitted in the amplifier section 2, is guided in each case. Thereby, the reflection spectra of the reflectors 7*a* to 7*d* can be changed independently of one another additionally in the above-described manner by way of the tuning elements arranged on the reflectors 7*a* to 7*d* in each case, and specifically in adequately wide limits, in order as a whole to permit an infinite tuning over a relatively large wavelength interval. The intervals which can be run through by way of tuning the individual reflectors 7*a* to 7*d* overlap for this.

Figure 2:
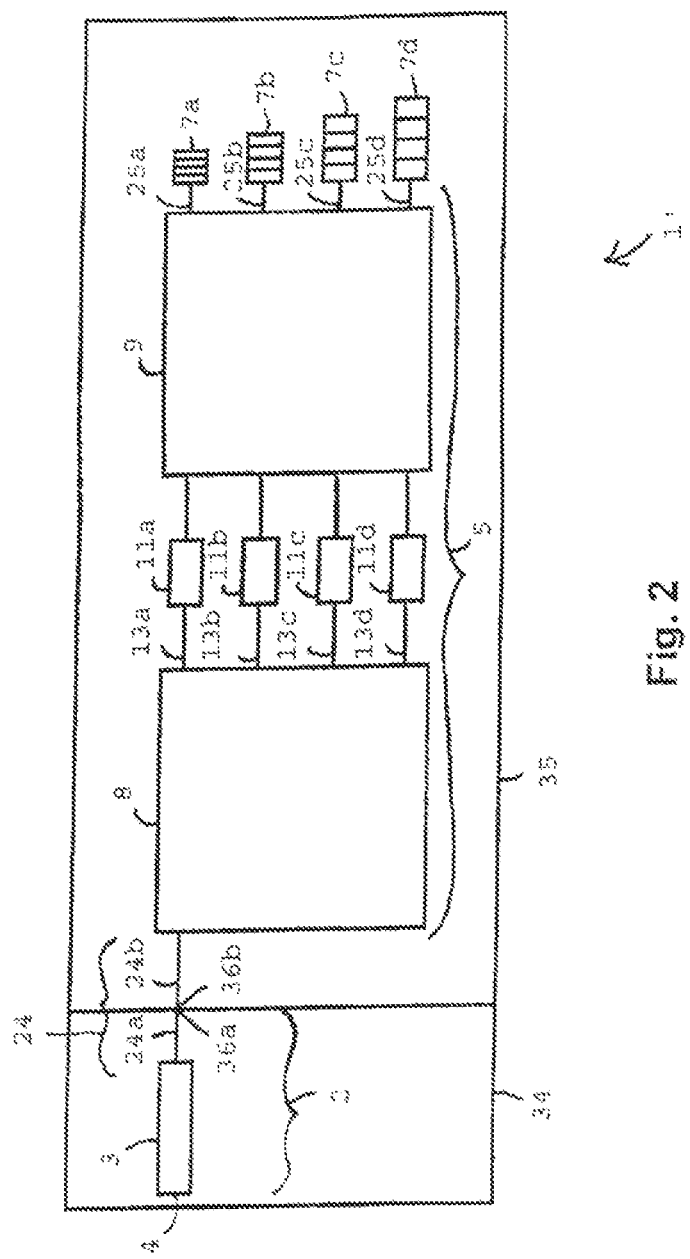

FIG. 2 shows embodiments of a DBR laser 1' which is realised here with hybrid integration. Thereby, recurring features here and hereinafter are in each case provided with identical reference numerals. The embodiments shown in FIG. 2 differ from the embodiments shown in FIG. 1 only in that the connection section 2 is arranged on a first substrate 34 of silicon, whereas the connection section 5 with the first MMI coupler 8 and the second MMI coupler 9 as well as the wavelength-selective Bragg reflectors 7*a* to 7*d* are arranged on a second substrate 35, wherein the second substrate is formed from a polymer. Here too, the active material 3 is connected via the single-mode waveguide 24 to the input 23 of the first MMI coupler 8. The substrates 34 and 35 are directly adjacent one another, so that a first section 24*a* of the single-mode waveguide 24 runs on the first substrate 34 and a second section 24*b* of the waveguide 24 runs on the second substrate 35. An end 36*a* of the first section 24*a* which faces the connection section 5 as well as an end 36*b* of the second section 24*b* which faces the amplifier section 2 are de-mirrored in each case, in order to avoid reflections at a boundary layer between the first section 24*a* and the second section 24*b* of the waveguide 24. Here, the first section 24*a* and the second section 24*b* of the waveguide 24 should be designed in each case as ridge waveguides which are arranged in each case on surfaces of the substrate 34 and 35. With a slightly modified embodiment, one can envisages the waveguide 24 being designed as an optical single-mode fibre, for the optical coupling of the amplifier section 2 and the connection section 5 which are arranged on different substrates.

Figure 3:
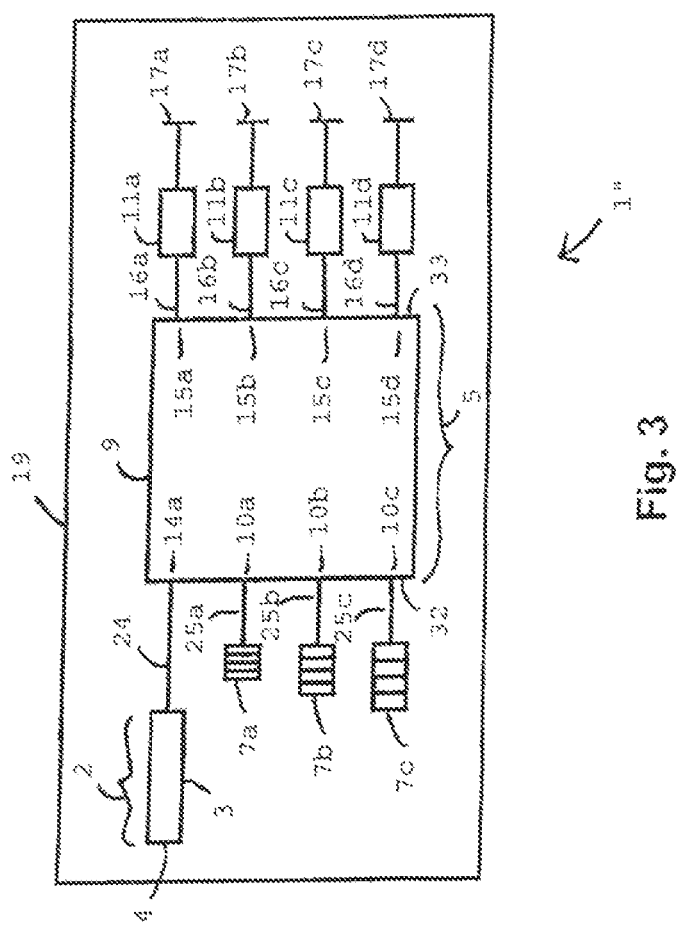

FIG. 3 shows embodiments of the DBR laser which is indicated here at 1" and with which again all components are arranged on the silicon substrate 19. These embodiments differ from the previously shown ones in that the connection section 5 only comprises one MMI coupler 9. The outputs 10*a* to 190*c* of the MMI coupler 9 in FIG. 3 are arranged at the same first side 32 of the MMI coupler 9 as the input 14*a*. Each of the outputs 10a to 10c are connected to exactly one of three different wavelength-selective Bragg reflectors 7a to 7c, via single-mode waveguides 25a to 25c Additionally, the MMI coupler 9 in FIG. 3 comprises four further outputs 15a to 15d which lie opposite the outputs 10a to 10c which are connected to the wavelength-selective reflectors 7a to 7c, and opposite the input 14a of the MMI coupler 9. The further outputs 15a to 15d of are thus arranged at a second side 33 of the MMI coupler 9, wherein the second side 33 lies opposite the first side 32.

The further outputs 15a to 15d are each connected by single-mode waveguides 16a to 16d to exactly one of four mirrors 17a to 17d which reflect back into the respective waveguide 16a to 16d. Here, the mirrors 17a to 17d are each designed as facets, which is to say as terminating surfaces of the single-mode waveguides 16a to 16d. The light reflected at the mirrors 17a to 17d is coupled again into the MMI coupler 9 at the further outputs 15a to 15d.

Exactly one of four phase shifters 11a to 11d are arranged in a course of each of the single mode waveguides 16a to 16d. Optical path lengths of the waveguides 16a to 16d can be changed in each case by way of the phase shifters 11a to 11d. With the embodiments shown in FIG. 3, the phase shifters 11a to 11d comprise electrode pairs which are arranged directly on the respective waveguides 16a, 16b, 16c and 16d respectively and to which electrical voltages can be applied in each case.

The wavelength-selective reflectors 7a to 7c here too are thus optically coupled to the amplifier section 2 by way of the connection section 5. Reflection spectra of the wavelength-selective reflectors 7a to 7c are different in each case. In particular maxima of the reflection spectra of the reflectors 7a to 7c lie at different wavelengths in each case. The phase shifters 11a to 11d can be activated independently of one another. The DBR laser 1″ can be switched between a first optical resonator, a second optical resonator and a third optical resonator by way of activating at least one of the phase shifters 11a to 11d. The first optical resonator is delimited by a part-reflecting, optical output 4 of the amplifier section 2 and by the first wavelength-selective reflector 7a. The second optical resonator is delimited by the optical output 4 and the second wavelength-selective reflector 7b. The third optical resonator is delimited by the optical output 4 and by the third wavelength selective reflector 7c.

The phase shifters 11a to 11d are activatable in a manner such that the light which is produced in the amplifier section 2 and is coupled from the amplifier section 2 via the waveguide 24 at the input 14a into the MMI coupler 9 is can be guided in a freely selectable manner onto exactly one of the wavelength-selective reflectors 7a to 7c. Due to guiding this light in each case onto only exactly one of the reflectors 7a to 7c, the DBR laser 1″ is switched to the optical resonator which is delimited by this reflector 7a, 7b or 7c and accordingly emits with a wavelength which is defined by the refection spectrum of this reflector 7a, 7b, 7c or 7c.

With the embodiments shown in FIG. 3 and which are characterised by their particular compactness, the light produced in the amplifier section 2 runs through the MMI coupler 9, the waveguides 16a to 16d and the phase shifters 11a to 11d exactly four times in each case with a complete circulation in the respectively selected optical resonator. Thus the light produced in the amplifier section 2 is firstly coupled at the input 14a into the MMI coupler 9 and from there via the two further outputs 15a to 15d and the waveguides 16a to 16d onto the mirrors 17a to 17d. After reflection at the mirrors 17a to 17d, the light is reflected back in each case into the waveguides 16a to 16d and from the waveguides 16a to 16d is coupled at the further outputs 15a to 15d again into the MMI coupler 9. Optical phases of the coherent light led in the waveguides 16a to 16d are thereby changed by way of activation of the phase shifters 11a, to 11d, in a manner such that the light after the second passage or sweep through the MMI coupler 9 constructively interferes e.g. only at the output 10a, whereas it destructively interferes at the two other outputs 10b and 10c. In an analogous manner, one can succeed in constructive interference only resulting at the output 10b or only at the output 10c by way of a different activation. With this, the light after the second passage through the MMI coupler 9 in the first case is only guided onto the first wavelength-selective reflector 7a. After reflection—in the case mentioned by way of example—at the first reflector 7a, the light at the output 10 in turn is coupled into the MMI coupler 9 and runs through this as well as the waveguides 16a to 16d a third time. After a second reflection at the mirrors 17a to 17d, the light runs through the waveguides 16a to 16d and the MMI coupler 9a fourth time, wherein the light at the input 14a is again led into the waveguide 24 and is led via this back into the amplifier section 2.

The first resonator thus comprises the amplifier section 2, the waveguide 24, the MMI coupler 9, the waveguides 16a to 16d with the phase shifters 11a to 11d which are arranged in their course in each case, the mirrors 17a to 17d as well as the waveguide 25a and the wavelength-selective reflector 7a. The second resonator instead of the waveguide 25a and the first reflector 7a comprises the waveguide 25b and the second reflector 7b. Accordingly, the third resonator compared with the first resonator, comprises the waveguide 25c instead of the waveguide 25a and the third reflector 7c instead of the first reflector 7a.

The DBR laser 1 thus at the optical output 4 in each case emits laser light of an emission wavelength which is selected in dependence on the refection spectrum of the respectively selected reflector from a wider gain spectrum of the amplifier section 2. That which has been said with regard to the previous embodiment examples accordingly applied with regard to the tuneability of the individual, wavelength-selective reflectors 7a, 7b, 7c.

The invention claimed is:
1. A tunable DBR laser comprising:
an amplifier section containing an active material;
a part-reflecting optical output;
a connection section, the connection section being connected to the amplifier section at an end of the amplifier section which lies opposite the part-reflecting output; and
at least two wavelength-selective reflectors, the wavelength-selective reflectors being optically coupled to the amplifier section by way of the connection section,
wherein the connection section comprises at least one MMI coupler and several waveguides running next to one another, so that different optical paths lead from the amplifier section to the wavelength-selective reflectors, each of the different optical paths leading through the at least one MMI coupler and through one of the waveguides to one of the wavelength-selective reflectors, wherein the wavelength-selective reflectors differ from one another by having different reflection spectra and wherein each of the wavelength-selective reflectors is connected to one of several outputs of the at least one MMI coupler, wherein a phase shifter is arranged in a course of at least one of the waveguides, so that the DBR laser by way of activating the at least one phase shifter can be switched over between different resonators, each of the resonators being delimited by one of the wavelength-selective reflectors.

2. The DBR laser of claim 1, wherein the connection section comprises a first MMI coupler and a second MMI coupler, wherein each of several outputs of the first MMI coupler is connected by way of one of the waveguides running next to one another to one of several inputs of the second MMI coupler and wherein each of the wavelength-selective reflectors is connected to one of several outputs of the second MMI coupler.

3. The DBR laser of claim 1, wherein the connection section comprises at least two mirrors and wherein the at least one MMI coupler comprises at least two further outputs, the further outputs lying opposite the outputs of the MMI coupler which are connected to the wavelength-selective reflectors, each of the further outputs being connected by way of one of the waveguides running next to one another to one of the mirrors, which reflects back into this waveguide, wherein the amplifier section is optically coupled to an input of the MMI coupler.

4. The DBR laser of claim 3, wherein the input of the MMI coupler lies opposite the further outputs of the MMI coupler.

5. The DBR laser of claim 1, wherein the at least one MMI coupler is an N×N coupler.

6. The DBR laser of claim 1, wherein the at least one phase shifter comprises a heating element.

7. The DBR laser of claim 1, wherein the at least one phase shifter is an electro-optical element.

8. The DBR laser of claim 1, comprising a semiconductor substrate, the amplifier section being arranged on the semiconductor substrate.

9. The DBR laser of claim 8, wherein at least one of (i) the semiconductor substrate and (ii) at least one waveguide arranged on the semiconductor substrate and (iii) the at least one MMI coupler is at least partly made of InP or of InGaAsP or of InGaAlAs.

10. The DBR laser of claim 1, wherein the active material is a semiconductor material.

11. The DBR laser of claim 1, wherein the active material contains InP at least one of InGaAsP and InGaAlAs.

12. The DBR laser of claim 1, wherein the amplifier section and the connection section are arranged on different substrates.

13. The DBR laser of claim 12, wherein at least one of (i) an end of the amplifier section which faces the connection section and (ii) an end of the connection section which faces the amplifier section is de-mirrored.

14. The DBR laser of claim 1, wherein a reflectivity of the part-reflecting optical output at an emission wavelength of the DBR laser is at least 75%.

15. The DBR laser of claim 1, wherein a reflectivity of the part-reflecting optical output at an emission wavelength of the DBR laser is 95% at the most.

16. The DBR laser of claim 1, wherein at least one of the wavelength-selective reflectors is continuously tunable, so that the reflection spectrum of this wavelength-selective reflector can be changed.

17. A method of operating a DBR laser, the DBR laser comprising an amplifier section containing an active material, a part-reflecting optical output, a connection section, and at least two wavelength-selective reflectors, wherein the connection section is connected to the amplifier section at an end of the amplifier section which lies opposite the part-reflecting output, wherein the wavelength-selective reflectors is optically coupled to the amplifier section by way of the connection section, wherein the connection section comprises at least one MMI coupler and several waveguides running next to one another, so that different optical paths lead from the amplifier section to the wavelength-selective reflectors, each of the different optical paths leading through the at least one MMI coupler and through one of the waveguides to one of the wavelength-selective reflectors, wherein the wavelength-selective reflectors differ from one another by having different reflection spectra and wherein each of the wavelength-selective reflectors is connected to one of several outputs of the at least one MMI coupler, wherein a phase shifter is arranged in a course of at least one of the waveguides, so that the DBR laser by way of activating the at least one phase shifter can be switched over between different resonators, each of the resonators being delimited by one of the wavelength-selective reflectors, the method comprising:

activating the at least one phase shifter in a manner such that light which is produced in the amplifier section and which is coupled out from the amplifier section into the connection section is guided only onto exactly one of the wavelength-selective reflectors, so that the DBR laser emits laser light of an emission wavelength which is selected from a gain spectrum of the amplifier section in a manner dependent on the reflection spectrum of the selected wavelength-selective reflector, the gain spectrum of the amplifier section being broader than the reflection spectrum of the selected wavelength-selective reflector.

* * * * *